United States Patent [19]

Harms et al.

[11] Patent Number: 5,151,655
[45] Date of Patent: Sep. 29, 1992

[54] MAGNETIC RESONANCE IMAGING USING A BACK-TO-BACK PULSE SEQUENCE

[75] Inventors: Steven E. Harms, Dallas; Duane P. Flamig, Richardson; Richard H. Griffey, Dallas, all of Tex.

[73] Assignee: Baylor Research Institute

[21] Appl. No.: 569,100

[22] Filed: Aug. 17, 1990

Related U.S. Application Data

[63] Continuation-in-part of Ser. No. 484,119, Feb. 23, 1990.

[51] Int. Cl.$^5$ ............................................. G01R 33/20
[52] U.S. Cl. ..................................... 324/309; 324/307
[58] Field of Search ............... 324/300, 307, 309, 318, 324/322, 308, 310, 311, 312, 313, 314; 128/653 R, 653 A

[56] References Cited

U.S. PATENT DOCUMENTS

| | | | |
|---|---|---|---|
| 4,707,658 | 11/1987 | Frahm et al. | 324/309 |
| 4,728,890 | 3/1988 | Pattany | 324/309 |
| 4,748,409 | 5/1988 | Frahm et al. | 324/309 |
| 4,766,379 | 8/1988 | Miyazaki | 324/309 |
| 4,902,974 | 2/1990 | Maeda et al. | 324/312 |
| 4,973,906 | 11/1990 | Bernstein | 324/309 |
| 4,982,161 | 1/1991 | Twieg | 324/309 |
| 4,999,580 | 3/1991 | Meyer et al. | 324/309 |

*Primary Examiner*—Michael J. Tokar

[57] ABSTRACT

Methods for improved MR imaging of an object by the use of back-to-back adiabatic RF pulse sequences. In one embodiment, a selective component suppressed MR image of the internal structure of an object is produced from a series of gradient echoes received in response to the generation of back-to-back opposing adiabatic half passage selective component suppressive RF pulses separated by 180 degrees in phase. In another embodiment, an enhanced MR image of the internal structure of an object is produced from a series of gradient echoes received in response to the generation of back-to-back opposing adiabatic half passage selective component suppressive RF pulses separated by 90 degrees in phase.

27 Claims, 3 Drawing Sheets

MAGNETIC RESONANCE IMAGING USING A BACK-TO-BACK PULSE SEQUENCE

CROSS REFERENCE TO RELATED APPLICATION

This application is a continuation-in-part of U.S. patent application Ser. No. 07/484,119, filed Feb. 23, 1990, pending, which is hereby incorporated by reference as if reproduced in its entirety.

BACKGROUND OF THE INVENTION

1. Field of the Invention

This invention relates to magnetic resonance imaging and, more particularly, to a method for producing an image of an object from a gradient echo pulse sequence produced in response to a back-to back pulse sequence. This invention further relates to a method for producing a selective component suppressed, three dimensional image of an object.

2. Description of Related Art

Magnetism results from the motion of electric charges such as electrons. Electrons can produce a magnetic field either by motion along a path or by virtue of their intrinsic spin. The particles that comprise the atomic nucleus, collectively called nucleons, also have spin and magnetic moment. Because both individual nucleons and nuclei have a charge distribution, rotation or spin of this charge produces a magnetic dipole whose value is called a magnetic moment. The numeric value of the magnetic moment determines the energies of the different orientations of a nucleus in an external magnetic field. The proton is positively charged and has a relatively large magnetic moment. Although neutral, the neutron also has a net magnetic moment. A neutron's magnetic moment is about two-thirds of the value of the proton's and points against the axis of spin. When in the nucleus, like nucleons align with their spins pointing against each other. This phenomena is called "pairing" and is favored because it leads to a lower nuclear energy state. Therefore, only the unpaired, odd proton or neutron, or both, contribute their magnetic moment to the nucleus. As a consequence, only nuclei with odd numbers of protons or neutrons, or both, have a magnetic moment. The magnetic properties of nuclei become important when they are placed in external magnetic fields as the nuclei will have a tendency to align with the external field.

Resonance occurs when an amount of energy equal to the difference of energy associated with the transition between states is absorbed or released. In the case of a magnetic moment of a nucleus, transitions between parallel or "up" and anti-parallel or "down" states can occur if the correct amount of energy is absorbed or released. Because the interaction is with a magnetic element, the necessary energy can be provided by a magnetic field. One way to obtain such a field is by utilizing electromagnetic radiations. To induce resonance, the frequency f of the electromagnetic radiation must be proportional to the local magnetic field $H_L$. The particular proportionality constant which will induce resonance varies depending on the particular nucleus involved. The relationship between frequency and field is given by:

$$f = (\text{gamma}) H_L / 2(\text{pi}) \tag{1}$$

where (gamma) is the magnetogyric ratio of the nucleus.

When the nuclei, originally in equilibrium with the field, are irradiated at the resonant frequency, the nuclei can adopt the anti-parallel state. When the return to equilibrium, if the field is unchanged, they will radiate emissions of the same frequency. If between excitation and radiation the field strength is changed, the nuclei will radiate a frequency corresponding to the new field value. This behavior of nuclei may be described by net magnetization vector N which characterizes the system by disregarding the state of each nucleus and considers only the net collective effect. In a magnetic field, the magnetization vector points along the field. The length of the magnetization vector is proportional to the number of nuclei in the sample and to the field strength and is inversely proportional to temperature. The length and direction of this vector characterizes the equilibrium magnetization of the sample; that is, the state that it will revert to after being disturbed if enough time is allowed to pass. This equilibrium magnetization is given by:

$$(\text{mu})^2 H / kT \tag{2}$$

where:
- (mu) is the nuclear magnetic moment;
- k is Boltmann's constant; and
- T is the absolute temperature.

This vector can be disturbed from equilibrium by the application of a second external magnetic field. If such a field is superimposed upon the first magnetic field, M will align with the new net field. As M moves to its new direction, energy stored in the nuclei of the sample is provided by the second field. When the superimposed field is removed, M returns to equilibrium and the nuclei release the stored energy to the environment, either as heat or RF energy. These two fields are called the transverse field and the longitudinal field, respectively. More specifically, the component of M that points along the main field is called the longitudinal magnetization ($M_L$) and the orthogonal component is called the transverse magnetization ($M_T$). If the transverse field is an RF field at the resonant frequency, M behaves as a top such that, as it deviates from the longitudinal axis, it precesses about it. If the main magnetic field is defined as being aligned along the z axis, then $M_T$ rotates in the x,y plane and $M_L$ is reduced from its equilibrium value. If M is rotated onto the x,y plane by a 90 degree RF pulse, $M_L$ is 0.

Immediately after an RF irradiation, $M_L$ begins to grow again towards its equilibrium value M. This growth is exponential with a time constant T1 such that:

$$M_L = M[1 - exp(-t\ T1)] \tag{3}$$

where t is the time since irradiation.

During this process, $M_T$ decays exponentially with a time constant T2 such that:

$$M_T = M_{T0} exp(-t\ T2) \tag{4}$$

where
- $M_{T0}$ is the value of $M_T$ immediately after irradiation; and
- t is the lapse time.

When a proton is aligned with the magnetic field, it gives off no signal. When a proton is perpendicular to the field, it gives off a maximum signal. The rate at which a proton realigns with the static field is called its "T1" or "T1 relaxation time". The T1 relaxation time is also called "spin-lattice" or "thermal relaxation time". The individual protons exchange fixed amounts of energy when they flip from the down to up alignment in the process of returning to equilibrium. This exchange can occur only at the resonant frequency. A molecule in the lattice surrounding the resonant nucleus appears as an oscillating electric magnetic field with frequency that depends on its thermal velocity and mean free path. Since both vary over a broad range for any one temperature, of the whole ensemble of molecules, only a small fraction provide the right oscillating fields. These then coupled with the nucleus and allow the relaxation to occur. As temperature and molecular composition changes so does the distribution of velocities and mean free paths, thus affecting T1.

When a group of protons precess in phase, the voxel gives off a maximum signal. When a group of protons precess out of phase, the voxel gives off no signal. The rate at which the protons de-phase is called its "T2" or "T2 relaxation time". The T2 relaxation time is also called the "spin-spin" or "transverse relaxation time". In a perfectly uniform magnetic field, all nuclei will resonate at exactly the same frequency, but if the field is even slightly inhomogeneous, nuclei resonate at slightly different frequencies. Although immediately after an RF irradiation, the nuclei are all in phase, they soon lose coherence and the signal that is observed, decays. Any such loss of coherence shortens T2. Thus, the effects due to inhomogeneities in the external field produce a rapid decay characterized by the relaxation time T2.

Magnetic resonance has become an established method for producing an image of the internal structure of an object. Such methods have numerous applications particularly in medical diagnostic techniques. For example, the examination and diagnosis of possible internal derangements of the knee is one such application of magnetic resonance imaging techniques. Most magnetic resonance techniques for knee imaging use a two-dimensional (or "2 D") acquisition with a spin-echo pulse sequence to provide T1, T2 and proton density weighted images of the knee in multiple planes, typically the sagittal (y-z) and coronal (x-z) planes. However, the selective excitation techniques used by conventional 2 D methods is limited in the ability to obtain thin slices by the gradient strength of the system. Furthermore, obtaining images in non-orthogonal planes is often advantageous for proper medical diagnosis. However, to obtain images in a non-orthogonal plane, the use of 2 gradients rather than a single gradient is required to obtain a slice. Finally, oblique plane imaging of an object requires a corrected procedure after obtaining each gradient echo to keep the slices passing through the object being imaged.

As a result of the shortcomings of 2 D methods, three dimensional (or "3 D") acquisitions of magnetic resonance data has been used to produce thin slice, high resolution images. See, for example, the publications to Harms and Muschler, "Three-Dimensional MR Imaging of the Knee Using Surface Coils", *Journal of Computer Assisted Tomography;* 10(5): 773-777 (1986) and Sherry et al., (Spinal MR Imaging: Multiplanar Representation from a Single High Resolution 3 D Acquisition", *Journal of Computer Assisted Tomography;* 11(5): 859-862 (1987); Robert L. Tyrrell, "Fast Three-dimensional MR Imaging of the Knee: Comparison with Ar-throscopy", *Radiology;* 166: 865-872 (1988); Charles E. Spritzer, et al., "MR Imaging of the Knee: Preliminary Results with a 3DFT GRASS Pulse Sequence", *American Journal of Roentology;* 150: 597-603 (1987); Alan M. Haggar, et al., "Meniscal Abnormalities of the Knee: 3DFT Fast-Scan GRASS MR Imaging", *American Journal of Roentology;* 150: 1341-1344 (1988).

It has long been desired to suppress the imaging of fat and/or water when producing MR images in connection with the examination and diagnosis of abnormalities of the orbit, head and neck, bone marrow, liver, breast and soft tissue masses as well as the cervical spine, knees, ankles, elbows, shoulder, wrist, lower legs, hips, thighs, and pelvis. Fat suppression has been long desired for T1 weighted sequences because MR images of fat generally tends to be of a sufficiently high signal intensity that lesions in anatomical parts with large amounts of fat, or where fat and other soft tissues are intermixed may be obscured. For example, the female breast is approximately 89% fat. When an MR image of a breast is produced, the fat appears as a high intensity image. However, a breast tumor would also appear as high intensity images in an MR image. As a result, the identification of a tumor using an MR image is difficult. This difficult diagnostic situation can be made even worse with the use of paramagnetic contrast agents that increase the signal of enhancing lesions by T1 shortening. As a result, the high signal intensity from contrast enhancing lesions can be made invisible by surrounding high signal intensity fat.

A variety of methods are available for producing fat suppressed images. One such technique is generally referred to as chemical shift imaging. As chemical shift imaging utilizes four dimensional imaging, it is very time consuming and highly inefficient, particularly if one considers that images from only two lines, fat and water, are required to produce fat suppressed images. Fat or water can be selectively saturated or excited. Selective saturation requires an additional RF pulse that lengthens the TR and is less effective with steady state sequences. Selective excitation is difficult considering RF and magnetic field inhomogeneities inherent to many objects.

Spectral information can also be obtained by phase encoding based upon differences in the chemical shift evolution between fat and water. Phase methods require two excitations and post-processing to yield fat and water images from in-phase and out-of-phase images. Differences in the relaxation properties of fat and water are used in STIR sequences to achieve fat suppressed images.

Recently introduced dedicated image processing work stations for medical imaging have made real time image plane reformatting, maximum pixel ray tracing (angiography), and surface renderings a clinical reality. These image processing routines are best performed on high resolution, thin slice image data sets that are optimally obtained by 3 D acquisition methods. The selective excitation technique used by conventional 2 D methods is limited in the ability to obtain thin slices by the gradient strength of the system and cannot approach the practical limit of 3 D acquisitions and slice thinness. A gradient echo sequence with a short TR is usually chosen for a 3 D acquisition. Most of the previously described fat suppression schemes cannot be used in a very short TR, and do not provide adequate SNR for thin slice 3 D acquisitions or require additional projections at length in the scan time.

Short T1 inversion recovery (or "STIR") techniques require a long TR which would make a high resolution 3 D acquisition prohibitively long. The fat signal in STIR is suppressed by shorting the signal at the known T1 point of fat. BO or RF inhomogeneity could result in an inadequate fat suppression and bright spots in the image that could result in incorrect image interpretation. Since fat has a much shorter T1 than most other soft tissues, the measurement of STIR signals is early in the longitudinal relaxation of most tissues. As a result, fat suppression technique is performed at the expense of a lower signal-to-noise (or "SNR") ratio. Since a high SNR is critical for thin slices and a short TR is required a reasonable scan time, STIR cannot be effectively used for 3 D acquisitions.

Phase difference methods, often referred to as the Dixon method, can be used to produce summed and opposed phase images. These methods require at least two excitations that would double the scan time of an already lengthy 3 D acquisition time. One of the major limitations of phase difference methods is the increased sensitivity to motion artifacts that result not only from doubling the number of projections but from the knee for two projections for the calculations. Since these projections are required at different times during the scan, any movement between projections result in motion artifacts that are compounded in the image calculations. These effects are particularly pronounced in 3 D acquisitions which tend to be more motion sensitive than conventional 2 D studies because of the larger number of projections needed for image reconstruction. Also, while phase difference methods could be used for 3 D imaging, the problems of longer scan time and motion sensitivity make these methods a less attractive choice. Finally, variations in the magnetic field strength across the object causes phase errors which cannot be corrected.

The chopper method uses opposed directional selective excitation gradients and requires at least two selected radio frequency pulses in the sequence. Single RF pulse graded echo sequences could not use this method. To achieve the needed shifted fat and water resonance for fat suppression using the sequence, a narrow bandwidth, which can only be achieved at the expense of longer TE and TR values, is required. The echo times and repetition times needed for the few sequence choices that could employ this method would be prohibitively long for a 3 D acquistion.

Chemical shift selective presaturation (or "Chem-SAT") requires an additional radio frequency pulse in the sequence to presaturate fat. The RF pulse is a narrow bandwidth that requires a long excitation time, thereby resulting in a longer TR. Chemical shift presaturation produces non-resonant transverse magnetization that decreases the fat suppression effects and can result in artifacts when short TR steady-state sequences are employed. The longer TR, diminished fat suppression, and associated artifacts made Chem-SAT a less attractive choice for fat suppression and 3 D acquisitions.

It is an object of this invention to produce a selective, component-suppressed, three dimensional image of an object.

It is yet another object of this invention to provide a high resolution, magnetic resonance image of an object for use with paramagnetic contrast agents used for diagnostic purposes.

It is still yet another object of this invention to produce a pulse sequence which produces chemical shift selection in a steady state sequence with an improvement in signal-to-noise ratio that is optimized for producing high resolution, thin slice magnetic resonance images.

Yet another object of this invention is to produce an MR image of an object with minimal artifacts.

SUMMARY OF THE INVENTION

In one embodiment, the present invention is of a method for producing a selective component suppressed MR image of the internal structure of an object comprised of at least two components. A uniform magnetic field is generated to magnetize the object to be imaged. First, second and third changing magnetic fields are then generated along the x-axis, the y-axis and the z-axis, respectively, of the object. A series of back-to-back selective component suppressive RF pulses are generated to produce transverse magnetization in the components of the object other than the component being suppressed. A series of gradient echoes are received in response to the generated series of back-to-back selective component suppressive RF pulses and an image of the object in which the selected component is suppressed is then produced. In one aspect of this embodiment of the invention, the series of back-to-back selective component suppressive RF pulses is produced by generating a first selective component suppressive RF pulse and then immediately generating a second selective component suppressive RF pulse which differs from the first selective component suppressive RF pulse in that the phase of the pulse has been shifted by approximately 180 degrees. In a second aspect of this embodiment of the invention, the series of back-to-back selective component suppressive RF pulses is comprised of a series of back-to-back opposing adiabatic half passage RF pulses.

In another embodiment, the present invention is of a method for producing an enhanced three dimensional magnetic resonance image of an object comprised of at least one component. A uniform magnetic field is generated to magnetize the object being imaged. First, second, and third changing magnetic fields are then respectively generated along the x, y, and z axes of the object. Transverse magnetization is then produced to maximize the uniform excitation of the components of the object. A series of gradient echoes is received in response to the maximized uniform excitation of the component and an enhanced image of the object is then produced from the series of received gradient echoes. In one aspect of this embodiment of the invention, transverse magnetization is produced by generating a series of back-to-back RF pulses. In another aspect of this embodiment of the invention, the transverse magnetization is produced from a series of back-to-back RF pulses in which a first RF pulse is generated. Immediately thereafter, a second RF pulse which differs from the first RF pulse in that the phase of the pulse has been shifted by approximately 90 degrees. In a second aspect of this embodiment of the invention, the back-to-back RF pulses are comprised of opposing adiabatic half passage pulses.

BRIEF DESCRIPTION OF THE DRAWINGS

The present invention may be better understood, and its numerous objects, features and advantages will become apparent to those skilled in the art by reference to the following drawings in which.

DETAILED DESCRIPTION OF THE INVENTION

Figure 1:
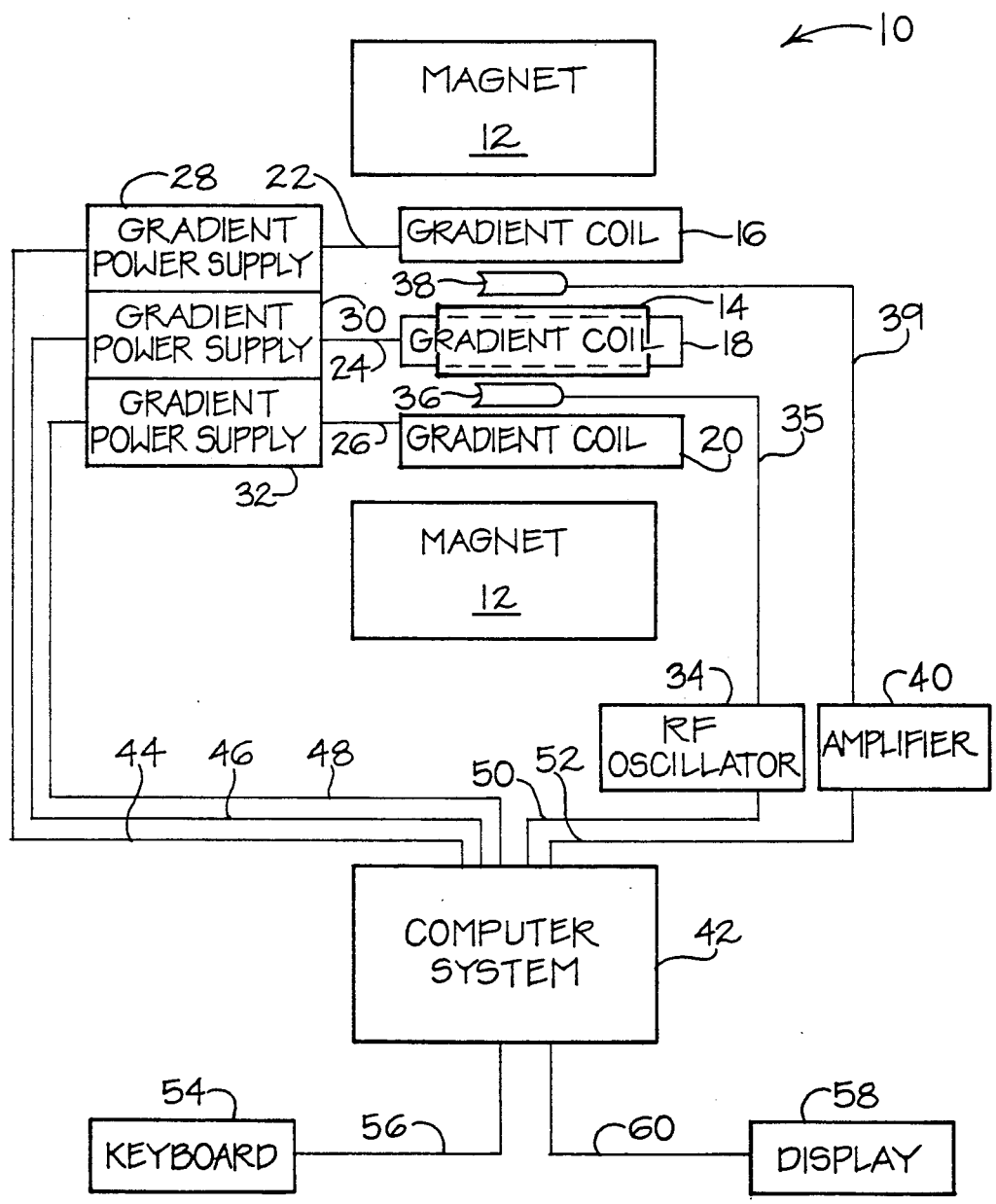
FIG. 1 is a block diagram of an apparatus for producing images of an object using magnetic resonance imaging techniques.

Referring first to FIG. 1, a magnetic resonance imaging system for use in conjunction with the teachings of the present invention shall now be described. As is well known in the art, magnetic resonance (or "MR") imaging requires a strong, uniform and stable magnetic field to magnetize the object being imaged. Accordingly, an MR imaging system 10 is provided with a magnetic 12, for example a superconducting magnet, for generating the aforementioned strong, uniform and stable magnetic field required for magnetizing an object 14 which is to be imaged. As magnetic imaging also requires rapidly changing weak magnetic field gradients along the x, y and z axis, the MR imaging system 10 is further provided with a first set of resistive or gradient coils 16 for generating a rapidly changing, weak magnetic field gradient along the x axis, a second set of gradient coils 18 for generating a rapidly changing, weak magnetic field gradient along the y axis, and a third set of gradient coils 20 for generating a rapidly changing, weak magnetic field gradient along the z axis. Each gradient coil set 16, 18, 20 may be, for example, two coils, each with currents flowing in a direction opposite to that in the other. Preferably, each gradient coil set 16, 18, 20 is configured to generate a gradient in a volume at the center of the coil set. The first, second and third gradient coil sets 16, 18, 20 are driven by a respective gradient power supply 28, 30, 32 connected to the corresponding gradient coil set 16, 18, 20 by an electrical connector 22, 24, 26, respectively, of conventional design. Preferably, each gradient coil subsystem 16, 22 and 28, 18, 24 and 30, 20, 26 and 32 should be configured to generate a 10 mT/m or greater gradient magnetic field controllable within precise limits with rise times of one msec or better.

As MR imaging further requires the generation of a radio frequency (or "RF") field to excite nuclear spins, the MR imaging system 10 further includes a low power RF oscillator 34 capable of amplitude and phase modulation as well as frequency changes required to meet imaging needs, an RF transmitter coil 36 which surrounds the object being imaged, and an RF receiver coil 38 which also surrounds the sample but which is orthogonal with respect to the RF transmitter coil 32. As the RF magnetic field generated by the RF transmitter coil 32 must be 90° to the main field generated by the magnet, the shape of the RF transmitter coil may be varied according to the direction of the main magnetic field with respect to the axis of the object 14. The RF oscillator 34 supplies RF power to the RF transmitter coil 36 via an electrical connector 35 where the RF magnetic field is transmitted into the object for exciting spins. Echoes are detected by the RF receiver coil 34, and transmitted via an electrical connector 39 to a low noise electronic amplifier 40 for digitization of the detected echoes. The RF field and echoes may be acquired using a Signa 1.5 Tesla imager manufactured by General Electric Medical Systems of Milwaukee, Wis. The imager is to be used typically in conjunction with a transmit-receive coil, also manufactured by General Electric Medical Systems, which is typically varied depending on the particular body area being imaged. For example, a quadrature head coil is to be used for cranial and foot examinations; a quadrature body coil is used for imaging of the thighs and pelvis; a linear transmit-receive extremity coil is preferably used in connection with the imaging of the knee, calf, ankle, arm and wrist; and receive-only surface coils are preferably used for the examination of the spine and shoulder.

The first, second and third gradient coil systems 16, 22 and 28, 18, 24 and 30, and 20, 26 and 32, as well as the RF transmitter coil 36 and RF receiver coil 38 are controlled by a computer system 42 via a corresponding electrical connector 44, 46, 48, 50 and 52, respectively. Typically, the computer system 36 will include a sequence control means for generating first, second and third voltage wave forms for transmission to the first, second and third gradient power supplies 28, 30 and 32 where first, second and third gradient magnetic pulse sequences corresponding to the voltage wave forms are produced for transmission by the first, second and third gradient coil sets 16, 18 and 20. The computer system 42 will further include means for generating an RF pulse sequence for transmission to the RF oscillator 34. Finally, the computer system 42 will also include data processing means for performing conventional data processing techniques such as Fourier transforms, data filtering and data storage functions. The computer system 42 is connected to an operator console 54, for example, a keyboard of conventional design, by an electrical connector 56 and display means 58, for example a CRT of conventional design, by an electrical connector 60. The operator of the console controls the production of an image of an object 14 through the computer system 42 as well as the display of the produced image by the display means 58. A computer system 42, operator console 54 and display means 58 which shall be satisfactory for the uses contemplated herein, may be provided by Model 3/260 workstation equipped with a TAAC accelerator manufactured by Sun Microsystems of Mountain View, Calif. Furthermore, if direct filming of the images displayed on the display means 58 are desired, a 35 mm camera may be used to photograph the displayed images.

Figure 2:
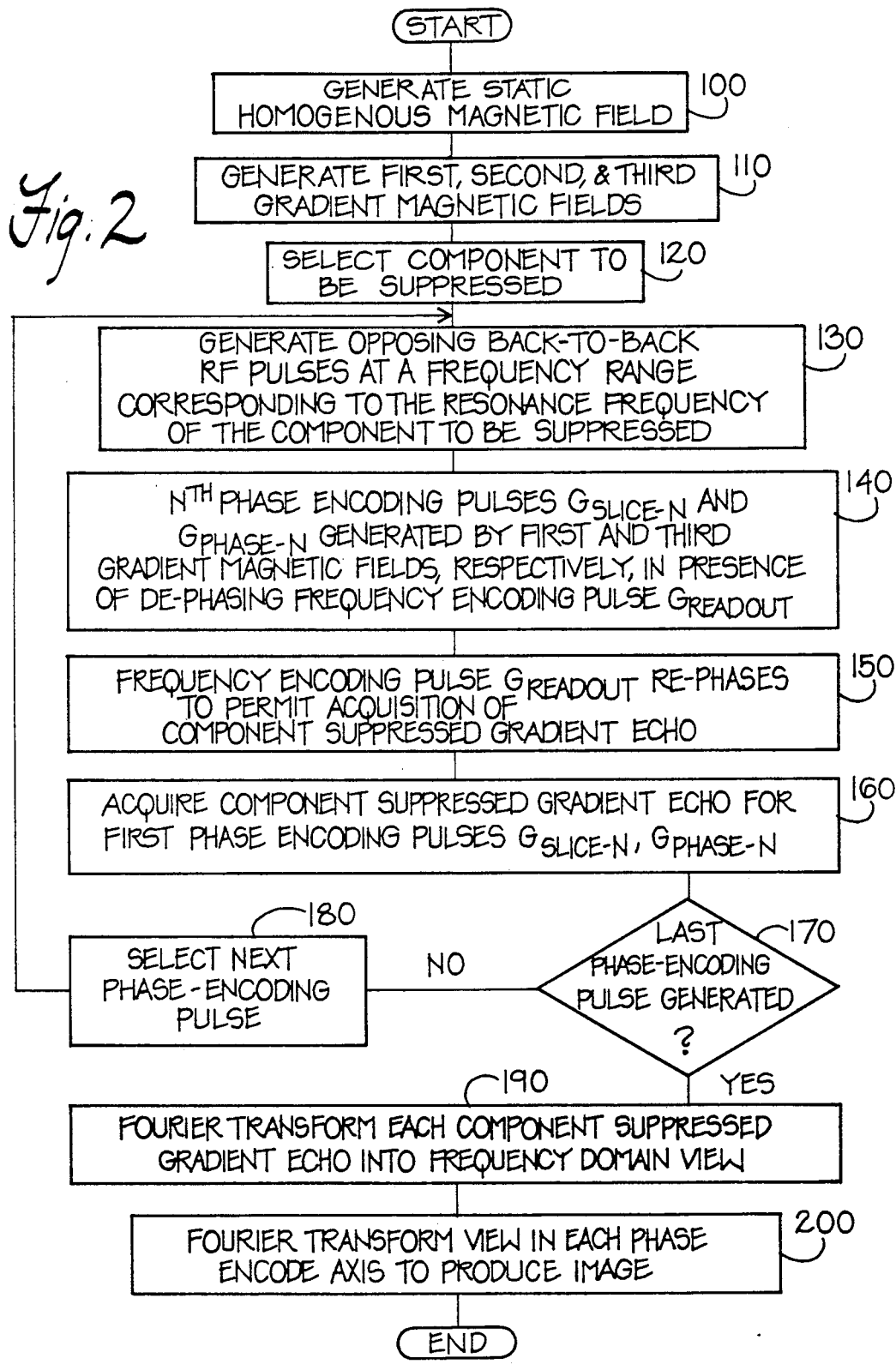
FIG. 2 is a flow chart of a method for producing images of an object using the method of selective component suppression magnetic resonance imaging subject of the present invention.

Referring next to FIG. 2, the method of producing a selective component suppressed, three dimensional image of an object in accordance with the teachings of the present invention shall now be described detail. Assuming that the center of the object 14 being imaged is the origin of a Cartesian coordinate system, a static homogenous magnetic field directed along the z axis of the Cartesian coordinate system is generated at step 100. Proceeding to step 110, gradient magnetic fields are generated along the z, as well as teh x and y, axis of the Cartesian coordinate system. As to be more fully described herein, the generated gradient magnetic fields are a first phase encoding gradient magnetic field directed along the x axis which is hereafter referred to as the $G_{SLICE}$ gradient magnetic field, a frequency encoding gradient magnetic field directed along the y axis which is hereafter referred to as the $G_{READOUT}$ gradient magnetic field, and a second phase encoding gradient magnetic field directed along the z axis which is hereafter referred to as the $G_{PHASE}$ gradient magnetic field.

Proceeding to step 120, a component of the object which is to be suppressed during the production of an image of the object is selected. Most commonly, it will be desired to suppress those portions of the image which correspond to fat to improve the diagnostic value of an image of the orbit, head, neck, bone marrow, liver, breast, soft tissue masses as well as other anatomical parts with large amounts of fat or where fat and other soft tissues are intermixed. It is fully contemplated, however, it will often be desirable to suppress those portions of the image which correspond to water to improve the diagnostic value of the image.

Proceeding to step 130, an RF pulse sequence is applied to generate transverse magnetism. More specifically, the RF transmitter coil 36 creates transverse magnetism by evolving a first RF magnetic field pulse sequence in the absence of additional magnetic field gradients and in the presence of the uniform magnetic field. In order to suppress the selected component while minimizing the generation of artifacts, the RF pulse sequence is comprised of a pair of back-to-back opposing RF pulses tuned to a specified frequency range which corresponds to the resonance frequency of the component to be suppressed. By using back-to-back opposing RF pulses, artifacts which would result due to interference between the RF echo and the gradient echo are avoided. For example, if it is desired to suppress the fat component during a low artifact imaging of a tissue sample having both fat and water components, the pair of back-to-back opposing RF pulses will be modulated with a carrier frequency of approximately 64 MHz, the resonance frequency of fat. As a result, the back-to-back opposing RF pulses will produce a net tip angle of zero degrees at the selected resonance frequency and there will be no net transverse magnetization of the fat component, thereby suppressing imaging of that component. Conversely, since the water component will be off resonance, transverse magnetization of the water component will evolve temporally, thereby providing for the generation of an echo from which an image of the non-suppressed components may be produced. In one embodiment of the invention, the applied RF pulse sequence may be comprised of back-to-back non-selective opposing adiabatic half frequency pulses of short duration, for example, 200 microseconds, generated in the absence of a slice selective gradient and having a repetition time $T_R$ between successive pulses of 20 milliseconds.

Figure 3:
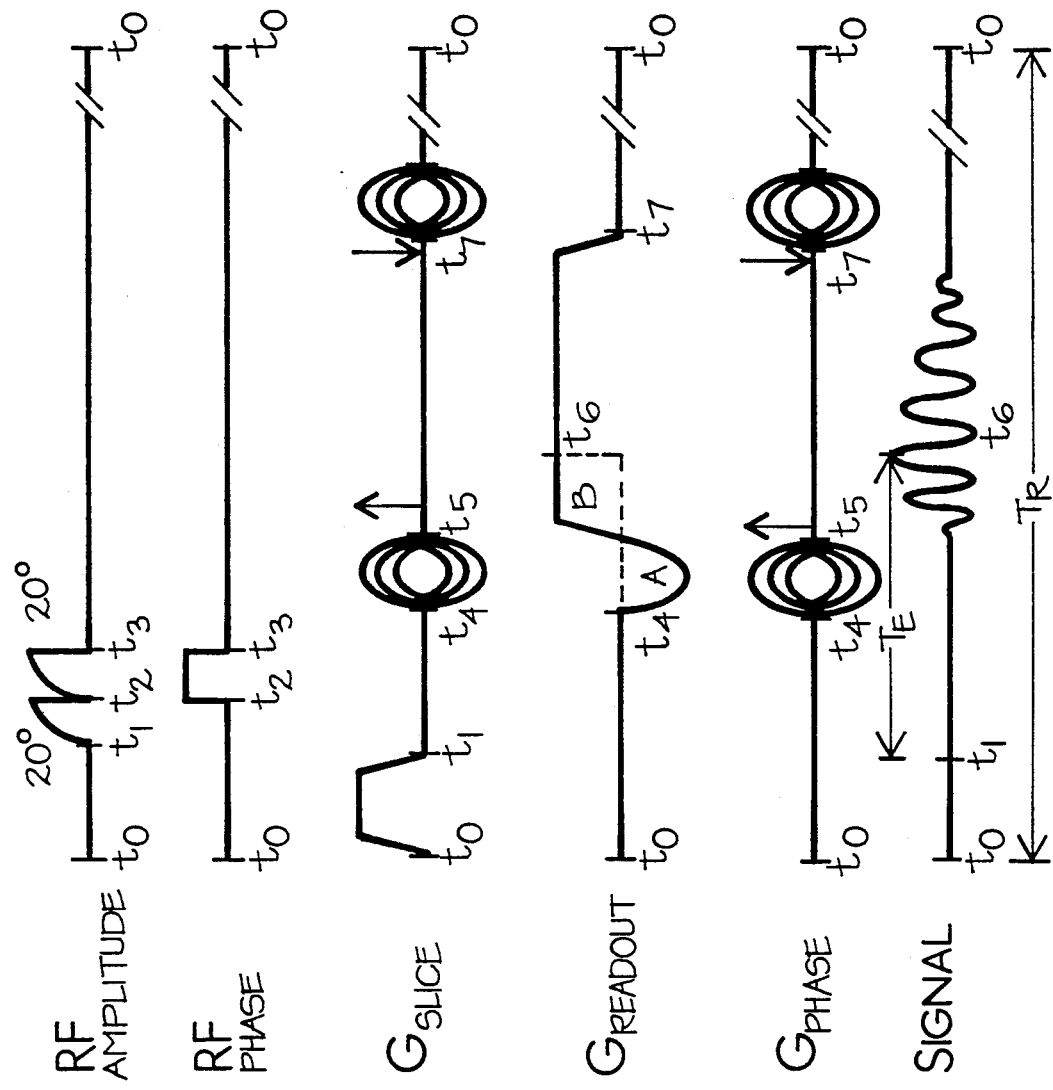
FIG. 3 is a schematic diagram of a selective component suppression magnetic resonance imaging sequence produced in accordance with the method of FIG. 2.

Proceeding to step 140, a first phase encoding pulse $G_{SLICE-1}$ along the slice axis and a first phase encoding pulse $G_{PHASE-1}$ along the phase axis are generated as part of the $G_{SLICE}$ and $G_{PHASE}$ gradients to be more fully described with respect to FIG. 3. The first phase encoding pulses $G_{SLICE-1}$ and $G_{PHASE-1}$ correspond to the application of the phase encoding gradients full force in a positive direction along the slice and phase axes, respectively. For successive phase encoding pulses $G_{SLICE-N}$ and $G_{PHASE-N}$, the respective phase encoding gradients are applied with successively less strength until, during the middle phase encoding pulses, the phase encoding gradients are turned off and during the last phase encoding pulses, the phase encoding gradients are applied full force in a negative direction along the slice and phase axes, respectively.

During the generation of the phase encoding pulses $G_{SLICE-1}$ and $G_{PHASE-1}$, the $G_{READOUT}$ frequency encoding pulse is negative, thereby dephasing the spins. At step 150, the $G_{READOUT}$ frequency encoding pulse goes positive, thereby permitting the acquisition of a component suppressed gradient echo for the first phase encoding pulses $G_{SLICE-1}$ and $G_{PHASE-1}$ and, at step 160, the acquisition of a first component suppressed gradient echo, most typically with an echo time on the order of 2.8 to 3.2 msec., by the RF receiver coil 34 is completed.

Proceeding to step 170, it is determined whether the last phase-encoding pulse, i.e. a phase-encoding pulse at full force in the negative direction along the slice and phase axes, has been generated. If it is determined that the last phase-encoding pulse has not been generated, a next phase-encoding pulse along the slice axis and a next phase-encoding pulse along the phase axis are selected at step 180. The method of the present invention then returns to step 130 for the generation of a next pair of back-to-back opposing RF pulses. In one aspect of the present invention, successive back-to-back opposing RF pulses are "jittered" to prevent the production of artifacts. By "jittering", the phase difference, either 90 or 180 degrees, between successive back-to-back opposing RF pulses is maintained but the values of the phases are shifted slightly or "jittered" for each iteration. For example both the first and second opposing RF pulses may be shifted by a randomly varying extent, for example, one degree, either positive or negative during an iteration. Finally, the phase difference, either 90 or 180 degrees, between successive back-to-back opposing RF pulses may be maintained but the values of the phases for a given back-to-back opposing RF pulse set may be shifted by a quantitized amount such as 90 degrees to produce maximum signal intensity in the produced MR image.

If it is determined at step 170 that echoes corresponding to full force phase-encoding pulse in the negative direction along the slice and phase axes have been received, data acquisition is completed and the method of the present invention proceeds to step 190 for processing of the acquired data.

Typically, the acquired data may be viewed as a matrix of dimensions $128 \times 128 \times 1024$. This viewing matrix corresponds to a field of view of 20 cm. At step 190, therefore, the acquired data matrix is processed to determine the signal intensity at each location, thereby producing an image of the object by the application of well known Fourier transform data processing techniques. Accordingly, the data matrix is transformed into a series of frequency data views in the frequency domain by applying a first series of Fourier transforms in the time direction. At step 200, an image of the object is produced by applying a second and third series of Fourier transforms in the slice phase encode direction and in the phase encode direction. Preferably, the frequency domain should be oversampled to avoid aliasing data.

Because of the high signal intensity from vessels, maximum pixel intensity ray tracing algorithms can be applied to the image data to produce MR angiograms. This represents a significant departure from prior techniques because conventional format ray tracing has typically failed because the high intensity of the fat signal obscures high intensity signals from vessels or the like.

Referring next to FIG. 3, the method of three dimensional magnetic image resonance imaging with selectable component suppression which is the subject of the present invention shall be more fully described. More specifically, at time $t_0$, a spoiler pulse is applied along the slice axis to spoil the steady state RF generated spin echo. At time $t_1$, the spoiler pulse ends and the RF pulses are then generated in the absence of a slice-selective excitation gradient. More specifically, at time $t_1$, a first RF pulse, preferably an adiabatic half passage pulse, is generated for 200 microseconds at a first RF phase angle. At time $t_2$, the generation of the first RF pulse is complete and the generation of a second RF pulse, identical to the first RF pulse and of opposite phase is commenced. At time $t_3$, the generation of the second RF pulse is completed. Since the twenty degree adiabatic half passage pulses are preferably tuned to a frequency range, most typically the frequency range corresponding to the resonant frequency of fat, the pulses produce a net tip angle of zero degrees, thereby suppressing the fat component of the object being imaged. Since other components of the object, in the present example, water, does not have the same resonant frequency as fat, the RF pulses are additive, thereby producing transverse magnetization which excites the water component of the object. At time $t_4$, phase encoding pulses $G_{SLICE}$ and $G_{PHASE}$ are generated and frequency encoding pulse $G_{READOUT}$ goes negative to dephase the spins. At time $t_5$, phase encoding pulses $G_{SLICE}$ and $G_{PHASE}$ are completed and frequency encoding pulse $G_{READOUT}$ goes positive, thereby rephasing the spins and commencing acquisition of a gradient echo. The $G_{READOUT}$ pulse continues positive until, at time $t_6$, the area A under the READOUT axis between times $t_4$ and $t_5$ is equal to the area B above the READOUT axis between times $t_5$ and $t_6$. At time $t_6$, the acquired echo pulse is at its maximum amplitude. By adjusting the $G_{READOUT}$ gradient pulse sequence to the shape illustrated in FIG. 3, the acquired pulse is shaped into the desired component suppressed echo. At time $t_7$, the frequency encoding $G_{READOUT}$ pulse sequence returns to zero, thereby ending the acquisition of the echo. Rewinder gradients are then applied along the slice and phase axes. Typically, the rewinder gradients should have a magnitude equal to the phase encoding pulses $G_{SLICE}$ and $G_{PHASE}$ and generated in the opposite direction thereto. The sequence then repeats at $t_0$ for a next pair of phase encode pulses. The repetition time TR separating successive $t_0$ while maintaining a steady state should be minimized as much as possible to reduce scanning time required to produce an image. Accordingly, the repetition time is preferably 20 msec and the total scan time shall be approximately ten minutes.

In prior 3 D imaging techniques, it was often desireable to keep the water and fat signals in phase to improve the quality of the image produced. In contrast with such prior techniques, it is unnecessary to keep the water and fat components in phase when producing an image in accordance with the techniques described herein because the fat signal has been suppressed. As a result, the echo time can be significantly reduced, for example, to 2.8 msec for a 20 cm field of view or to 3.2 msec for a 14 cm field of view. Furthermore, since the fat signal is suppressed, this very short echo time can be achieved without perceptible chemical shift effects in the image due to fat and water being out of phase. The production of artifacts due to variations in the phase differences between water and fat across the object of interest are reduced.

In yet another aspect of the invention, the above described techniques for selective component suppressed MR imaging of an object may be modified to produce a non-component suppressed, enhanced MR image of an object in which the intensity of the component image signals are maximized. It is contemplated that such techniques would be particularly useful in producing MR angiograms and other imaging of venous structure such as arteries. To produce an enhanced MR image of an object, the RF pulse is modified such that the transverse magnetization produced maximizes the uniform excitation of the components. To do so, a series of back-to-back RF pulses, preferably adiabatic pulses are generated. While the first and second RF pulses which make up the back-to-back pulses should again be of equal magnitude, the phase of the two pulses should now be separated by ninety degrees.

As can be seen from the above description of the present invention, there are set forth herein an improved method of imaging an object using magnetic resonance techniques. By providing an RF pulse sequence comprised of back-to-back opposing adiabatic half passage pulses tuned to a frequency range corresponding to the resonant frequency of a component of the object, the signal corresponding to that component will be suppressed. By suppressing a component of the object, most typically fat, the echo time can be greatly reduced, thereby providing improved image contrast in combination with faster image production. It has been further discovered that by providing an RF pulse sequence comprised of back-to-back adiabatic pulses separated by ninety degrees, maximum excitation of the components of the object results, thereby resulting in an enhanced image.

However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. For a three dimensional object comprised of at least two components and having an x-axis, a y-axis and a z-axis, a method of producing a selective component suppressed MR image of the internal structure of said object comprising the steps of:

generating a uniform magnetic field to magnetize said object;

generating a first, second, and third changing magnetic fields along said x-axis, y-axis, and z-axis, respectively;

generating a series of back-to-back selective component suppressive RF pulses to produce transverse magnetization in said components of said object other than said component to be suppressed;

receiving a series of gradient echoes in response to said generated series of back-to-back selective component suppressive RF pulses; and producing an image of said object in which said selected component is suppressed.

2. A method of producing a selective component suppressed MR image according to claim 1 wherein the step of generating said series of back-to-back selective component suppressive RF pulses further comprises the steps of:

generating a first selective component suppressive RF pulse, said first RF pulse having an amplitude and a phase; and immediately generating a second selective component suppressive RF pulse after completing the generation of said first RF pulse, said second RF pulse produced by shifting said phase by approximately 180 degrees.

3. A method of producing a selective component suppressed MR image according to claim 1 wherein said series of back-to-back selective component suppressive RF pulses generates a net tip angle of zero degrees in said component being suppressed.

4. A method of producing a selective component suppressed MR image according to claim 1 wherein said series of back-to-back selective component suppressive RF pulses are generated at a frequency range corresponding to the resonant frequency for said component being suppressed.

5. A method of producing a selective component suppressed MR image according to claim 1 wherein interference between RF and gradient echoes are minimized, thereby minimizing the production of artifacts during the production of said image.

6. A method of producing a selective component suppressed MR image according to claim 1 wherein the production of artifacts is prevented by jittering successive pairs of back-to-back opposing RF pulses.

7. A method of producing a selective component suppressed MR image according to claim 1 wherein successive pairs of back-to-back opposing RF pulses are shifted by a quantitized amount to maximize the signal intensity of the produced MR image.

8. A method of producing a selective component suppressed MR image according to claim 1 wherein said series of back-to-back selective component suppressive RF pulses is comprised of a series of back-to-back opposing adiabatic half passage pulses.

9. A method of producing a selective component suppressed MR image according to claim 8 wherein the step of generating said series of back-to-back opposing adiabatic half passage pulses further comprises the steps of:
generating a first selective component suppressive adiabatic RF pulse, said first adiabatic RF pulse having an amplitude and a phase; and
immediately generating a second selective component suppressive adiabatic RF pulse after completing the generation of said first adiabatic RF pulse, said second adiabatic RF pulse produced by shifting said phase by approximately 180 degrees.

10. A method of producing a selective component suppressed MR image according to claim 9 wherein each of said selective component suppressive adiabatic RF pulses are generated for approximately 200 microseconds.

11. A method of producing a selective component suppressed MR image according to claim 10 wherein said suppressed component is water.

12. A method of producing a selective component suppressed MR image according to claim 10 wherein said suppressed component is fat.

13. A method of producing a selective component suppressed MR image according to claim 12 wherein suppressing the fat component reduces the production of artifacts during the production of said MR image.

14. A method of producing a selective component suppressed MR image according to claim 12 and further comprising the step of providing an echo time $T_E$ between said generated back-to-back opposing adiabatic half passage pulses and said received gradient echoes on the order of 2.8 to 3.2 msec.

15. A method of producing a selective component suppressed MR image according to claim 14 and further comprising the step of providing a repetition time $T_R$ between the generation of successive back-to-back opposing adiabatic half passage pulses of approximately 20 msec.

16. A method of producing a selective component suppressed MR image according to claim 15 wherein said back-to-back opposing adiabatic half passage pulses are generated at a frequency of approximately 64 MHz.

17. A method of producing a selective component suppressed MR image according to claim 16 wherein an MR angiogram is produced from a ray tracing reformatting of the data.

18. A method of producing an enhanced three dimensional magnetic resonance image of an object comprised of at least one component and having an x-axis, a y-axis and a z-axis, comprising the steps of:
generating a uniform magnetic field to magnetize said object;
generating a first, second, and third changing magnetic fields along said x-axis, y-axis, and z-axis, respectively;
producing transverse magnetization in said object;
maximizing uniform excitation of said at least one component of said object;
receiving a series of gradient echoes in response to said maximized uniform excitation of said at least one component; and
producing an enhanced image of said object from said series of received gradient echoes.

19. A method of producing an enhanced three dimensional magnetic resonance image of an object according to claim 18 wherein the step of producing transverse magnetization in said object further comprises the step of generating a series of back-to-back RF pulses to produce transverse magnetization in said object, said series of back-to-back RF pulses maximizing said uniform excitation of said at least one component.

20. A method of producing an enhanced three dimensional magnetic resonance image of an object according to claim 19 wherein the step of generating said series of back-to-back RF pulses further comprises the steps of:
generating a first RF pulse, said first RF pulse having an amplitude and a phase; and
immediately generating a second RF pulse after completing the generation of said first RF pulse, said second RF pulse produced by shifting said phase by approximately 90 degrees.

21. A method of producing a selective component suppressed MR image according to claim 20 wherein the production of artifacts from steady state magnetization is prevented by jittering successive pairs of back-to-back opposing RF pulses.

22. A method of producing a selective component suppressed MR image according to claim 20 wherein successive pairs of back-to-back opposing RF pulses are shifted by a quantitized amount to maximize the signal intensity of the produced MR image.

23. A method of producing an enhanced three dimensional magnetic resonance image of an object according to claim 21 wherein said back-to-back RF pulses is comprised of a series of back-to-back opposing adiabatic half passage pulses.

24. A method of producing an enhanced three dimensional magnetic resonance image of an object according to claim 23 wherein each of said adiabatic RF pulses are generated for approximately 200 microseconds.

25. A method of producing an enhanced three dimensional magnetic resonance image of an object according to claim 24 and further comprising the step of providing an echo time $T_E$ between said generated back-to-back opposing adiabatic half passage pulses and said received gradient echoes on the order of 2.8 to 3.2 msec.

26. A method of producing an enhanced three dimensional magnetic resonance image of an object according to claim 25 and further comprising the step of providing a repetition time $T_R$ between the generation of successive back-to-back opposing adiabatic half passage pulses of approximately 20 msec.

27. A method of producing an enhanced three dimensional magnetic resonance image of an object according to claim 26 wherein said back-to-back opposing adiabatic half passage pulses are generated at a frequency of approximately 64 MHz.

* * * * *